United States Patent
Wu et al.

(10) Patent No.: US 11,222,951 B2
(45) Date of Patent: Jan. 11, 2022

(54) EPITAXIAL SOURCE/DRAIN STRUCTURE AND METHOD

(71) Applicant: Taiwan Semiconductor Manufacturing Co., Ltd., Hsin-Chu (TW)

(72) Inventors: I-Wen Wu, Hsinchu (TW); Chen-Ming Lee, Taoyuan County (TW); Fu-Kai Yang, Hsinchu (TW); Mei-Yun Wang, Hsin-Chu (TW); Chun-An Lin, Tainan (TW); Wei-Yuan Lu, Taipei (TW); Guan-Ren Wang, Hsinchu (TW); Peng Wang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/551,546

(22) Filed: Aug. 26, 2019

(65) Prior Publication Data

US 2020/0075725 A1    Mar. 5, 2020

Related U.S. Application Data

(60) Provisional application No. 62/725,713, filed on Aug. 31, 2018.

(51) Int. Cl.
*H01L 29/08*    (2006.01)
*H01L 21/02*    (2006.01)
*H01L 29/66*    (2006.01)
*H01L 29/78*    (2006.01)

(52) U.S. Cl.
CPC .... *H01L 29/0847* (2013.01); *H01L 21/02532* (2013.01); *H01L 29/66795* (2013.01); *H01L 29/785* (2013.01)

(58) Field of Classification Search
CPC ....... H01L 21/02532; H01L 21/823821; H01L 21/3065; H01L 21/0265; H01L 21/0262; H01L 21/0243
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |

(Continued)

FOREIGN PATENT DOCUMENTS

| | | |
|---|---|---|
| KR | 100416694 B1 | 5/2004 |
| KR | 20180060906 A | 6/2018 |
| KR | 20180069668 A | 6/2019 |

*Primary Examiner* — Wasiul Haider
(74) *Attorney, Agent, or Firm* — Haynes and Boone, LLP (57) ABSTRACT

A method of semiconductor fabrication includes providing a semiconductor structure having a substrate and first, second, third, and fourth fins above the substrate. The method further includes forming an n-type epitaxial source/drain (S/D) feature on the first and second fins, forming a p-type epitaxial S/D feature on the third and fourth fins, and performing a selective etch process on the semiconductor structure to remove upper portions of the n-type epitaxial S/D feature and the p-type epitaxial S/D feature such that more is removed from the n-type epitaxial S/D feature than the p-type epitaxial S/D feature.

20 Claims, 8 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,691,902 B2* | 6/2017 | Kang ................... H01L 29/785 |
| 10,510,762 B2 | 12/2019 | Chiou et al. |
| 2007/0132032 A1* | 6/2007 | Teo ..................... H01L 29/7843 257/369 |
| 2016/0133632 A1* | 5/2016 | Park ................. H01L 29/66545 257/369 |
| 2017/0053912 A1 | 2/2017 | Ching et al. |
| 2017/0069756 A1 | 3/2017 | Chiang et al. |
| 2017/0243868 A1* | 8/2017 | Lee ..................... H01L 29/0649 |
| 2018/0082909 A1* | 3/2018 | Adusumilli ........... H01L 23/535 |
| 2018/0130886 A1* | 5/2018 | Kim .................... H01L 27/0924 |
| 2018/0151683 A1 | 5/2018 | Yeo et al. |

* cited by examiner

EPITAXIAL SOURCE/DRAIN STRUCTURE AND METHOD

CROSS-REFERENCE TO RELATED APPLICATIONS

This application claims priority to U.S. Provisional Patent Application Ser. No. 62/725,713 entitled "Optimized Epitaxial Structure and Method for Resistance and Capacitance Reduction" and filed on Aug. 31, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when forming a source/drain (S/D) feature for a FINFET, part of the S/D feature is epitaxially grown in the S/D region of the FINFET. Multiple epitaxial S/D features on different fins may merge during their growth to form a merged S/D feature. This way, a single contact feature may be formed on the merged S/D feature to control the sources/drains of multiple fins. While the merged S/D feature is a useful IC structure, its shape profile is often difficult to control. Although existing S/D formation processes have been generally adequate for their intended purposes, they have not been entirely satisfactory in all respects (e.g., realizing different shape profiles for n-type and p-type FINFETs).

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

During the fabrication of semiconductor transistor devices, as multiple epitaxial S/D features merge during their growth, it is sometimes difficult to control precisely the height of the merged S/D feature (called "merge height" or MH in short). Since an S/D contact feature sits above the merged S/D feature, the MH may impact a capacitance (C) between the S/D contact feature and a nearby metal gate structure. Further, when etching contact holes for depositing S/D contact features, it is sometimes difficult to optimize the contact hole profile for both n-type FINFET and p-type FINFET at the same time. Depending on whether a merged S/D feature is for an n-type FINFET or a p-type FINFET, its ideal contact hole profile is different. For instance, for an n-type FINFET, a deeper contact recess on the merged S/D feature may reduce a contact resistance (R) between the contact feature and the merged S/D feature. While for a p-type FINFET, a deeper contact recess may undesirably increase the contact resistance.

The present disclosure provides methods of forming epitaxial structures that have optimized shape profiles for resistance and capacitance reduction. According to some embodiments, a merged S/D feature may be formed with a raised merge height (MH). The raised merge height reduces an overlapping area of the S/D feature and a nearby metal gate, and therefore reduces a capacitance (C) therebetween. The raised merge height is achieved by multiple techniques. As a first example, before forming a merged S/D feature, the two underlying fins are partially etched to give room for epitaxial growth of the S/D feature. During this partial etch process, keeping a higher remaining fin sidewall height increases the merge height. The fin sidewall height, and thus the raised merge height, may be within a range of about 3-15 nanometers more than conventional fabrication processes, or about 0.1-0.5 times the fin pitch. As a second example, the epitaxial growth conditions of the S/D feature may be tailored to delay merging of separate S/D features on fins. Details of the embodiments are described below in conjunction with the figures.

Figure 1:
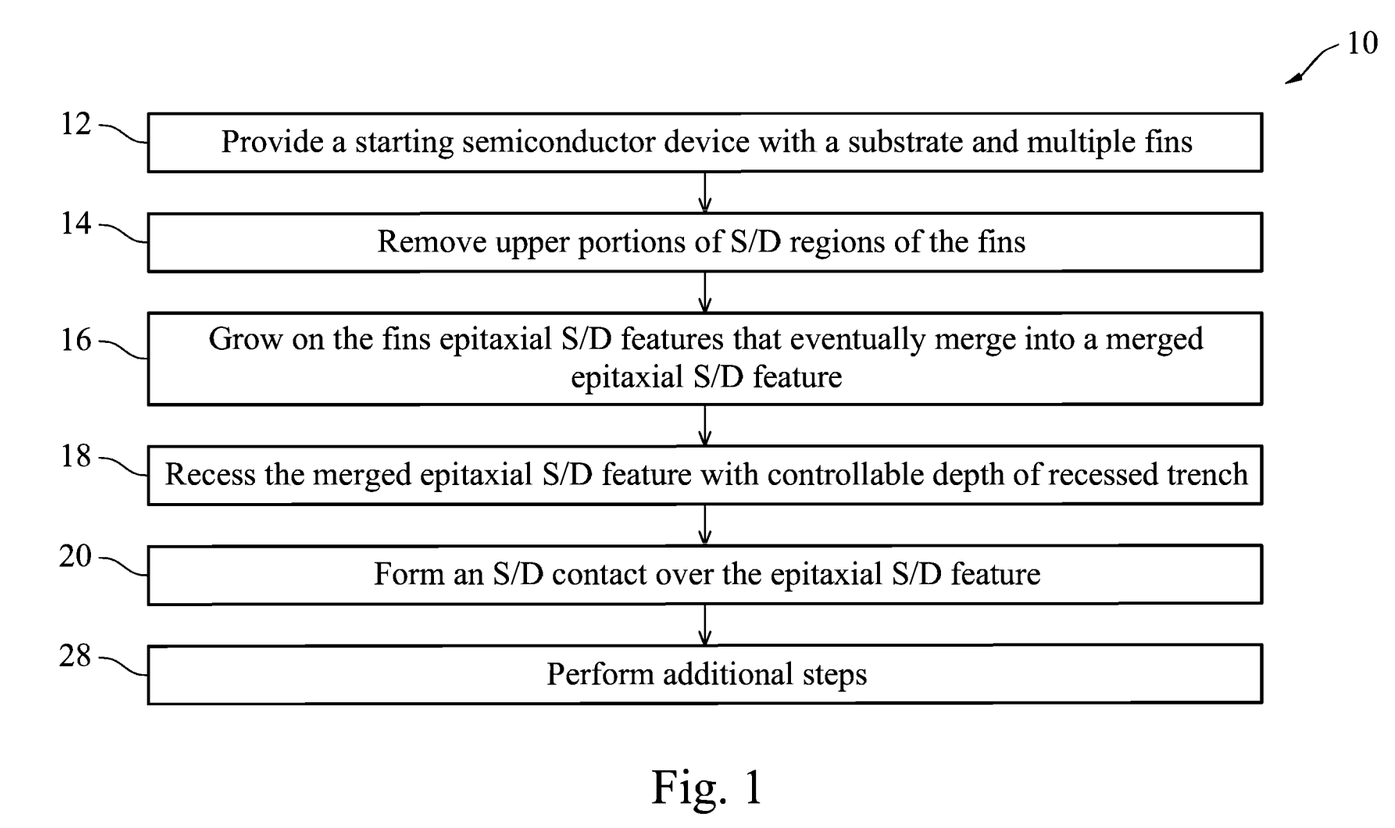
FIG. 1 is a flow chart of a method of forming a semiconductor device according to various aspects of the present disclosure.
Figure 2A:
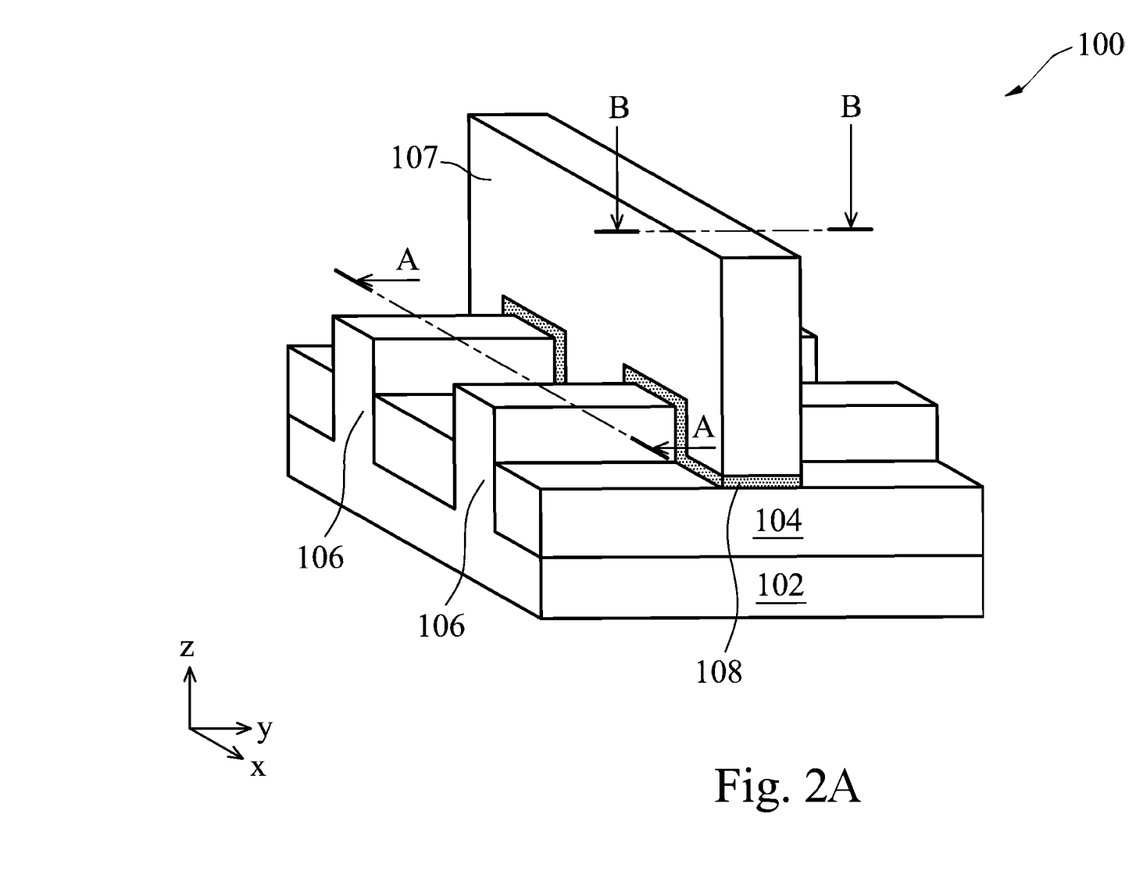
FIG. 2A illustrates a three-dimensional view of a portion of a semiconductor device in an intermediate stage of fabrication according to some embodiments.
Figure 2B:
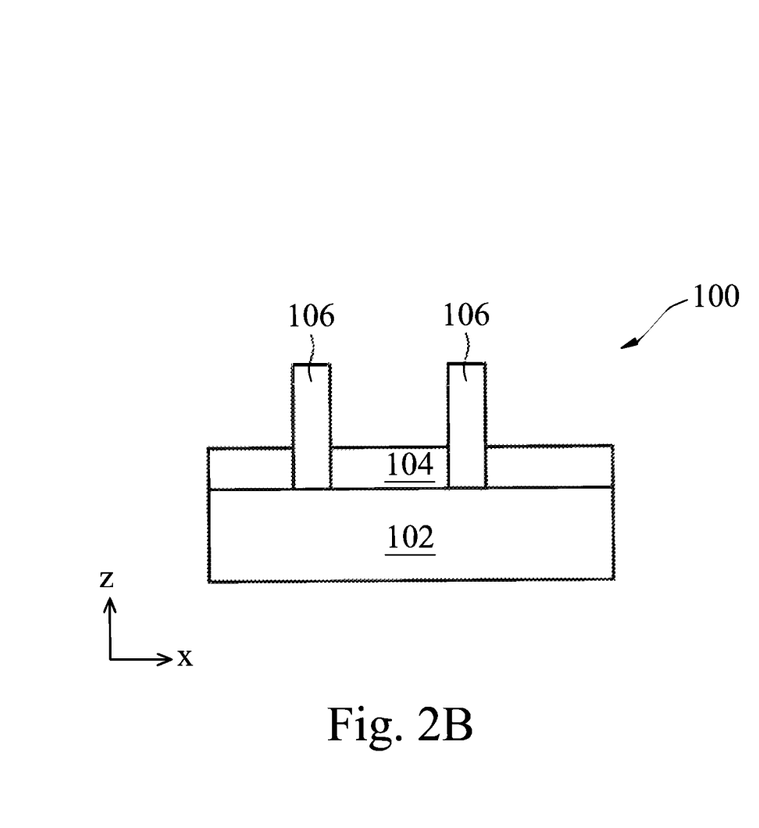
FIGS. 2B, 3A, and 4 are cross-sectional views of a portion of the semiconductor device in FIG. 2A, along the "A-A" line, in accordance with some embodiments, in intermediate stages of fabrication according to an embodiment of the method in FIG. 1.
Figure 2C:
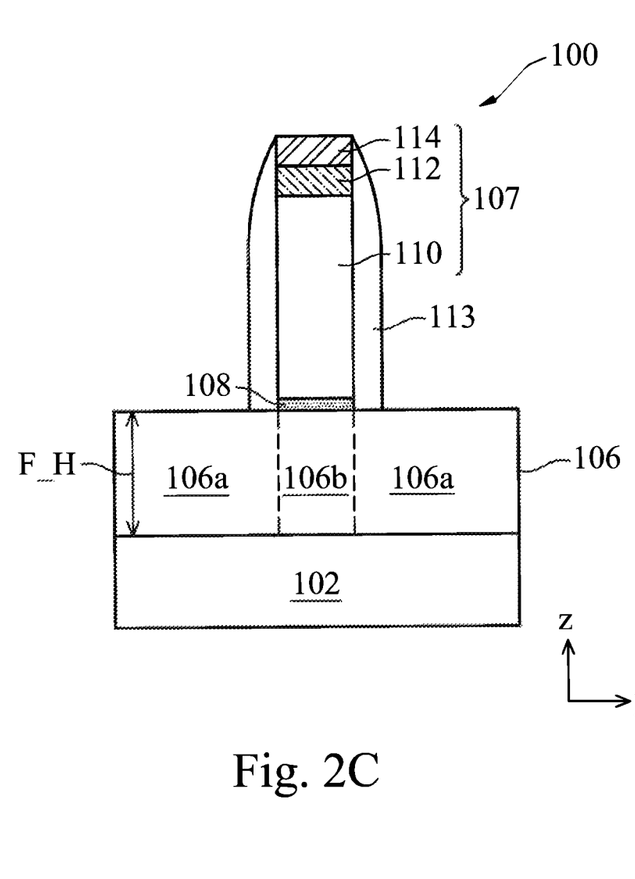
FIGS. 2C and 3B are cross-sectional views of a portion of the semiconductor device in FIG. 2A, along the "B-B" line, in accordance with some embodiments, in intermediate stages of fabrication according to an embodiment of the method in FIG. 1.
Figure 3A:
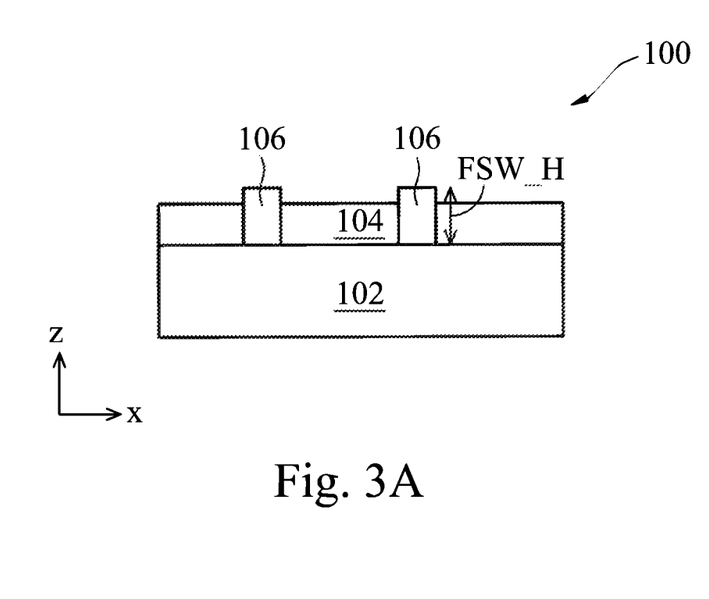
Figure 3B:
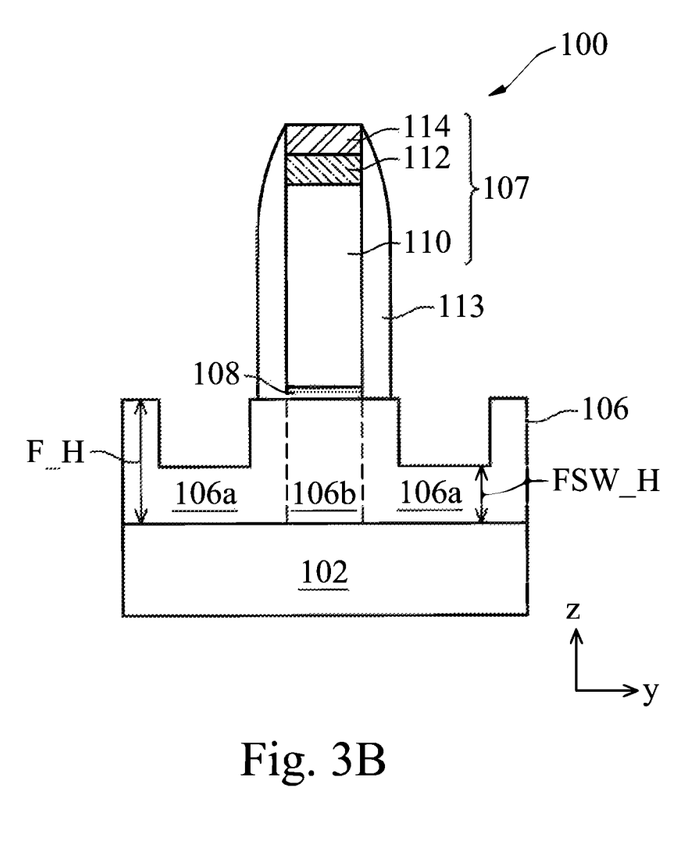
Figure 4:
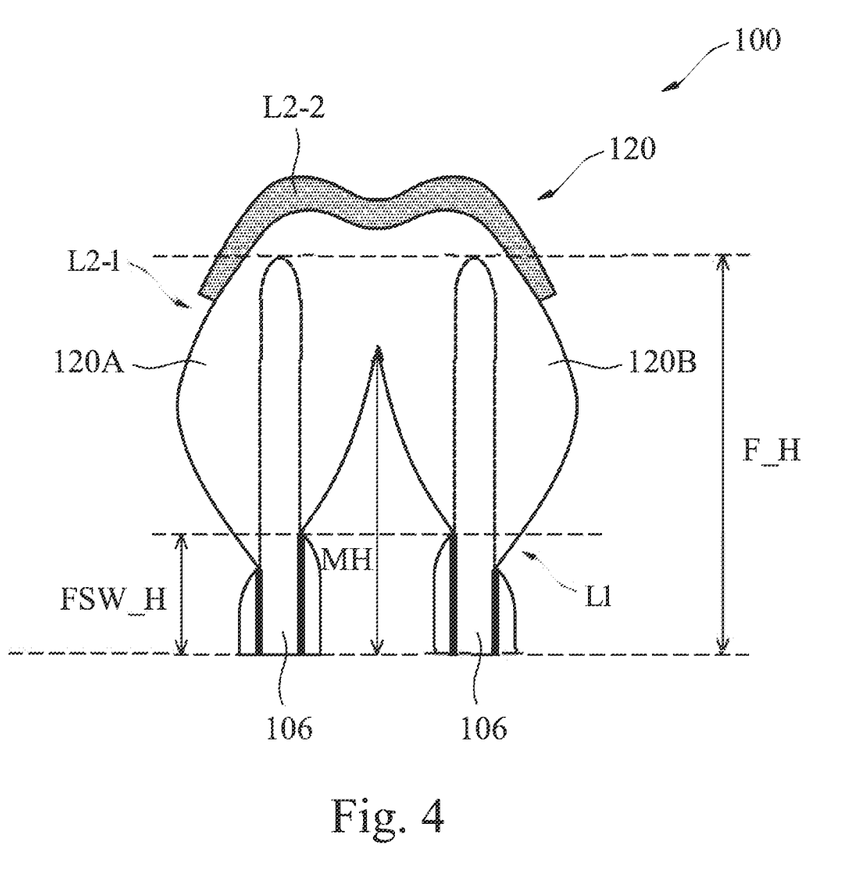
Figure 5:
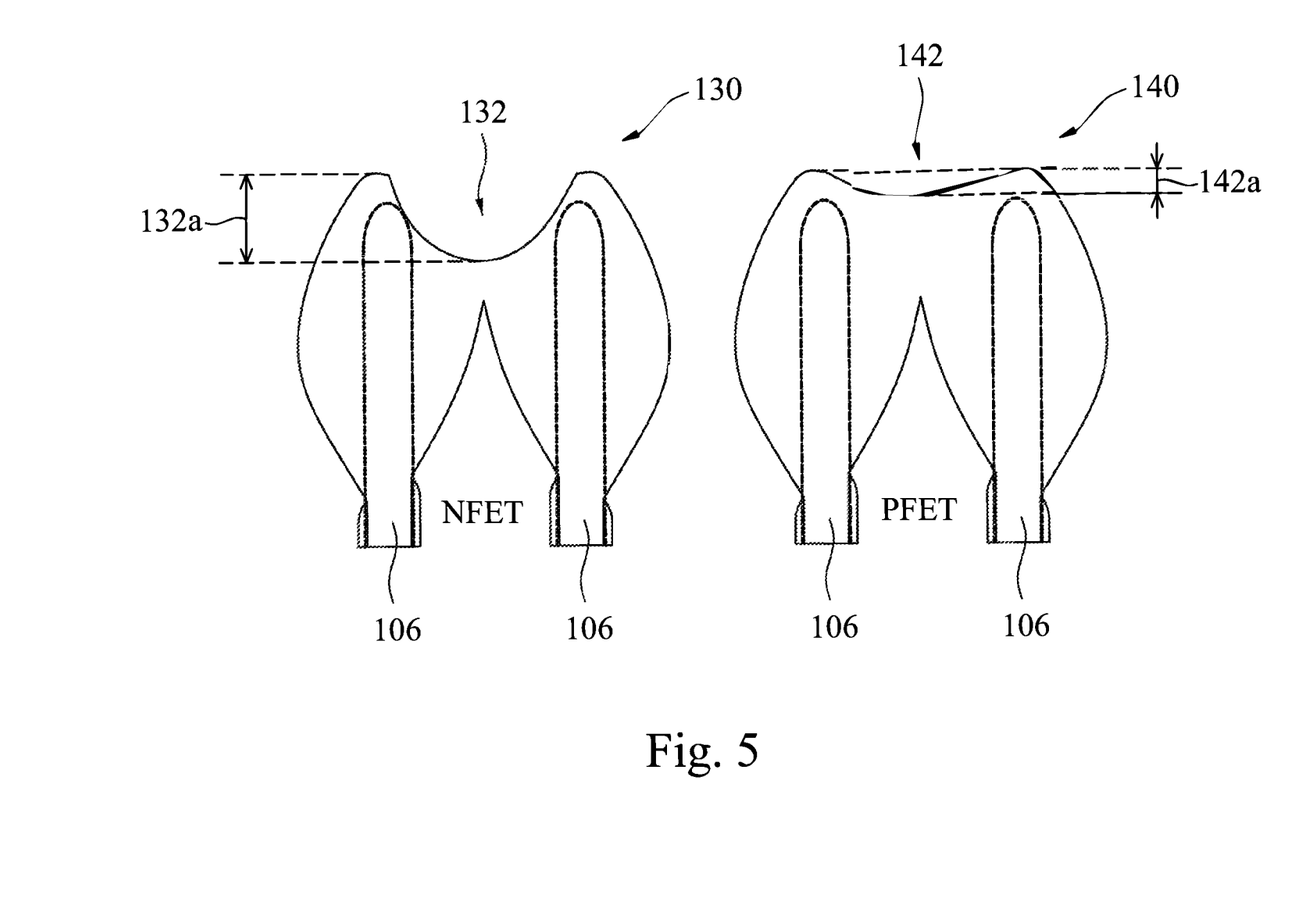
FIGS. 5 and 7 illustrate zoomed-in views of a portion of the semiconductor device in FIG. 2A, along the "A-A" line (with an additional merged epitaxial S/D feature), in accordance with some embodiments, in intermediate stages of fabrication according to an embodiment of the method in FIG. 1.

FIG. 1 illustrates a flow chart of a method 10 for forming a semiconductor device 100 (hereafter called "device 100" in short) in accordance with some embodiments of the present disclosure. The method 10 is merely an example and is not intended to limit the present disclosure beyond what is explicitly recited in the claims. Additional operations can be performed before, during, and after the method 10, and some operations described can be replaced, eliminated, or moved around for additional embodiments of the method. The method 10 is described below in conjunction with other figures, which illustrate various three-dimensional and cross-sectional views of the device 100 during intermediate steps of the method 10. In particular, FIG. 2A illustrates a three-dimensional view of the device 100; FIGS. 2B, 3A, and 4 illustrate cross-sectional views of the device 100 taken along line AA as shown in FIG. 2A; FIGS. 2C and 3B illustrate cross-sectional views of the device 100 taken along line BB as shown in FIG. 2A; FIGS. 5 and 7 illustrate zoomed-in views of the device 100 taken along line AA, but with an additional merged epitaxial S/D feature; FIGS. 6A-6E illustrates a partial view of FIG. 5 going through a recess forming process.

The device 100 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FINFETs), metal-oxide semiconductor field effect transistors (MOSFET), complementary metal-oxide semiconductor (CMOS) transistors, bipolar transistors, high voltage transistors, high frequency transistors, and/or other memory cells, The present disclosure is not limited to any particular number of devices or device regions, or to any particular device configurations. For example, though the device 100 as illustrated is a three-dimensional FET device (e.g., a FINFET or a gate-all-around (GAA) FET), the present disclosure may also provide embodiments for fabricating planar FET devices.

Referring to FIGS. 1 and 2A-2C, the method 10 at operation 12 provides (or is provided with) a starting device 100 that includes one or more semiconductor fins 106 (sometimes called "fins" in short) protruding from a substrate 102 and separated by isolation structures 104. A dummy gate stack 107 is disposed over the substrate 102 and intersects the fins 106. The device 100 may include other components, such as gate spacers (not included) disposed on sidewalls of the dummy gate stack 107, various hard mask layers disposed over the dummy gate stack 107 (discussed in detail below), barrier layers, other suitable layers, or combinations thereof.

The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

In some embodiments where the substrate 102 includes FETs, various doped regions, such as source/drain regions, are disposed in or on the substrate 102. The doped regions may be doped with p-type dopants, such as phosphorus or arsenic, and/or n-type dopants, such as boron or $BF_2$, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

A semiconductor fin 106 may be suitable for providing an n-type FET or a p-type FET. In some embodiments, the semiconductor fins 106 as illustrated herein may be suitable for providing FINFETs of a similar type, i.e., both n-type or both p-type. Alternatively, they may be suitable for providing FINFETs of opposite types, i.e., an n-type and a p-type. This configuration is for illustrative purposes only and is not intended to be limiting. The semiconductor fins 106 may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element (not shown) including the resist. The masking element is then used for etching recesses into the substrate 102, leaving the semiconductor fins 106 on the substrate 102. The etching process may include dry etching, wet etching, reactive ion etching (RIE), and/or other suitable processes.

Numerous other embodiments of methods for forming the semiconductor fins 106 may be suitable. For example, the semiconductor fins 106 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. In some embodiments, after its formation, the fins 106 have a height (denoted as F_H in FIG. 2C) between about 50 to about 90 nm. Such fin height is important for device performance and DC/AC balance.

Each of the fins 106 includes a channel region 106b and two S/D regions 106a sandwiching the channel region 106b. The S/D regions 106a are used to serve as source and drains of an FET, while the channel region 106b located under the gate stack 107 is used to serve as a channel that connects the source and drain. In some embodiments, the method 10 may include forming lightly doped S/D (LDD) features in the S/D regions 106a of the fins 106.

The isolation structures 104 may include silicon oxide, silicon nitride, silicon oxynitride, fluoride-doped silicate glass (FSG), a low-k dielectric material, and/or other suitable materials. The isolation structures 104 may include shallow trench isolation (STI) features. In one embodiment, the isolation structures 104 are formed by etching trenches in the substrate 102 during the formation of the semiconductor fins 106. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 104. Alternatively, the isolation structures 104 may include a multi-layer structure, for example, having one or more thermal oxide liner layers. The isolation structures 104 may be deposited by any suitable method, such as chemical vapor deposition (CVD), flowable CVD (FCVD), spin-on-glass (SOG), other suitable methods, or combinations thereof. The isolation structures 104 may be formed by depositing a dielectric layer as a spacer layer over the semiconductor fins 106 and subsequently recessing the dielectric layer such that a top surface of the isolation structures 104 is below a top surface of the semiconductor fins 106.

In some embodiments, the dummy gate stack 107 serves as a placeholder for subsequently forming a high-k metal gate structure (HKMG; where "high-k" refers to a dielectric constant greater than that of silicon dioxide, which is about 3.9). The dummy gate stack 107 may include an oxide layer 108 disposed over the channel region 106b. The oxide layer 108 may be formed by any suitable method, which may include deposition and etching. The oxide layer 108 may comprise silicon oxide or a high-k oxide (having a dielectric constant greater than that of silicon oxide) such as Hf oxide, Ta oxide, Ti oxide, Zr oxide, Al oxide or a combination thereof. The oxide layer 108 may be formed to have a thickness of few angstroms to few tens of angstroms.

The dummy gate stack 107 may include a dummy gate electrode 110. In some embodiments, the dummy gate electrode 110 includes polysilicon. In the depicted embodiment, referring to FIG. 2C, the dummy gate stack also includes a hard mask layer 112 disposed over the dummy gate electrode 110 and/or a hard mask layer 114 disposed over the hard mask layer 112. Sidewall spacers 113 are formed on the sidewalls of the dummy gate electrode 110. As will be discussed in detail below, portions of the dummy gate stack 107 are replaced with the HKMG during a gate replacement process after other components (e.g., the merged epitaxial S/D feature 120) of the device 100 are fabricated. The hard mask layers 112 and 114 may each include any suitable dielectric material, such as a semiconductor oxide and/or a semiconductor nitride. In one example, the hard mask layer 112 includes silicon carbonitride, and the hard mask layer 114 includes silicon oxide. Various material layers of the dummy gate stack 107 may be formed by any suitable process, such as CVD, PVD, ALD, chemical oxidation, other suitable processes, or combinations thereof.

Referring to FIGS. 1 and 3A-3B, the method 10 at operation 14 shortens portions of the S/D regions 106a, for example, by removing upper portions of the fins 106 while keeping their lower portions in the S/D regions 106a. In many embodiments, the method 10 partially removes by a suitable etching process, such as a dry etching process, a wet etching process, or an RIE process. In some embodiments, the method 10 selectively removes the semiconductor fins 106 without etching or substantially etching other components such as the dummy gate stack 107. The etching process at operation 14 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The extent of which the semiconductor fins 106 is removed may be controlled by adjusting conditions such as pressure, temperature, and the duration of the etching process. In some embodiments, the etching uses an etchant including HBr and $CF_4$, under a pressure between about 5 and about 30 millitorr, and at a temperature between about 30 to about 60 degrees Celsius. In some embodiments, the etching lasts for about 5 to about 10 seconds. In some embodiments, as shown in FIG. 3B, the etching process at operation 14 removes upper portions of the fins 106 such that a remaining height of the fins 106 (denoted as FSW_H in FIG. 3B, where FSW stands for fin sidewall) is between about 30% and about 40% of the original height of the fins 106 (i.e., F_H). As described below, keeping such a relatively high remaining fin sidewall height helps increase the merge height of a merged epitaxial S/D feature.

After shortening the S/D regions 106a, the method 10 proceeds to forming epitaxial S/D features on the shortened S/D regions 106a. FIG. 4 illustrates a simplified view focusing on two epitaxial S/D features 120A and 120B that are grown on two fins 106 and eventually merge into one merged epitaxial S/D feature 120. Referring to FIGS. 1 and 4, the method 10 at operation 16 grows the epitaxial S/D features 120A and 120B on two S/D regions 106a that are located on the same side of the dummy gate stack 107. The epitaxial S/D features 120A and 120B initially grow separately on their respective fins and eventually merge together at a certain height (called a merge height, or MH) to form the merged epitaxial S/D feature 120.

The present disclosure allows the merged epitaxial S/D feature 120 to achieve an optimized shape profile for resistance and capacitance reduction. In some embodiments, by controlling growth conditions and by increasing the remaining fin height (FSW_H) for about 3 to about 15 nm, the merged S/D feature 120 may have a raised merge height (MH), for example, about 2 to about 10 nm higher than merged epitaxial S/D features formed using other technologies. Such a raised merge height reduces an overlapping area of the merged S/D feature 120 and a nearby metal gate (which is to be formed as a replacement of the dummy gate stack 107), and therefore reduces a capacitance (C) therebetween.

The raised merge height of the merged epitaxial S/D feature 120 may be achieved by multiple techniques. In an example (as described above with respect to operation 14), before forming the merged S/D feature 120, the two underlying fins 106 are partially etched to give room for epitaxial growth of the S/D feature. During this partial etch process, keeping a higher remaining fin sidewall height (e.g., about 30% to about 40% of the fin height) increases the merge height of the merged epitaxial S/D feature 120.

In another example, the epitaxial growth conditions of the S/D feature may be tailored to delay merging of separate S/D features 120A and 120B on fins 106. In an embodiment, the merged epitaxial S/D feature 120 has multiple layers of semiconductor materials, including a first layer (L1), a second layer (L2-1), and a third layer of (L2-2). Changing the formation conditions of these layers may lead to a controllable MH. In some embodiments, the first epitaxial layer L1 is deposited on the top and sidewall surfaces of the S/D regions 106a. Further, the second epitaxial layer L2-1 wraps around the first epitaxial layer L1. In the embodiment shown in FIG. 4, the first epitaxial layers L1 of the epitaxial S/D features 120A and 120B do not merge, but the second epitaxial layers L2-1 of the epitaxial S/D features 120A and 120B laterally merge (i.e., touch each other). To form the structure as shown in FIG. 4, the operation 16 waits until the second epitaxial layers L2-1 laterally merge before growing the third epitaxial layer L2-2. Note that, depending on the lateral distance (along the "x" direction) between the two fins 106 and the control of the epitaxial growth, the first and second epitaxial layers, L1 and L2-1, may be formed to have different merging profiles.

In various embodiments, the different epitaxial layers may comprise same or different semiconductor materials such as silicon, germanium, silicon germanium, one or more III-V materials, a compound semiconductor, or an alloy semiconductor. In one embodiment, the fins 106 comprise silicon, and the epitaxial layers comprise silicon germanium. The epitaxial growth process may be a LPCVD process with a silicon-based precursor, a selective epitaxial growth (SEG) process, or a cyclic deposition and etching (CDE) process. For example, silicon crystal may be grown with LPCVD with silane ($SiH_4$) and dichlorosilane (DCS) gases. The controllable MH may depend on a ratio between silane ($SiH_4$) and dichlorosilane (DCS) gases, which are used to form the L2-1. In some embodiments, the controllable MH is no less than about 55% of the height of the fins 106 (F_H).

In some embodiments, the merged epitaxial S/D feature 120 includes: a first layer of semiconductor material (L1) grown on the lower portions of first and second fins 106, a second layer of semiconductor material (L2-1) grown on the L1, and a third layer of semiconductor material (L2-2) grown on the L2-1. In an embodiment, the L1 on the first fin 106 and the L1 on the second fin do not merge, while the L2-1 on the first fin and the L2-1 on the second fin merge at a controllable merge height. The controllable MH is dependent on a ratio between silane ($SiH_4$) and dichlorosilane (DCS) gases which are used to form the L2-1. The ratio between silane ($SiH_4$) and dichlorosilane (DCS) gases may be about 1:15 to about 1:50 in some embodiments. In an embodiment, the controllable MH is no less than about 55% of the height of the first and second fins. In an embodiment, the L2-2 has a substantially conformal thickness over the first and second fins.

After forming the merged epitaxial S/D feature 120, the method 10 proceeds to creating a recess thereon in preparation for forming a S/D contact on the merged epitaxial S/D feature 120. As described above, depending on whether a merged S/D feature is for an n-type FINFET or a p-type FINFET, its ideal contact hole profile is different. For instance, for an n-type FINFET, a deeper contact recess on the merged S/D feature may reduce a contact resistance (R) between the contact feature and the merged S/D feature. While for a p-type FINFET, a deeper contact recess may undesirably increase the contact resistance. The present disclosure allows for optimized recess profiles for an n-type FINFET or a p-type FINFET, as described below. To demonstrate two different profiles for an n-type FINFET or a p-type FINFET, FIG. 5 illustrates a cross-sectional view of two merged epitaxial S/D features, including a n-type merged epitaxial feature 130 and a p-type merged epitaxial feature 140, which are similar to the merged epitaxial feature 120 unless otherwise noted.

Referring to FIGS. 1 and 5, the method 10 at operation 18 recesses the merged epitaxial S/D features 130 and 140 to form recessed trenches therein. According to some embodiments, each recess profiles is optimized to reduce a contact resistance between a contact feature and the epitaxial S/D feature. Depending on whether the epitaxial S/D feature is for an n-type FINFET or a p-type FINFET, different recess profiles are achieved. As shown in FIG. 5, for the n-type merged epitaxial feature 130, a relatively deep contact recess 132 is achieved. The recess 132 is deep enough to ensure that all bottom silicon nitride (SiN) disposed on the n-type merged epitaxial feature 130 is removed, as any remaining silicon nitride may increase contact resistance. The recess 132 is not so deep that the n-type merged epitaxial feature 130 would be etched through. For the p-type merged epitaxial feature 140, a relatively shallow contact recess 142 is achieved so that an S/D contact may directly touch a region of the S/D having higher Ge and/or B concentration. The recess 132 may have a depth 132a within a range of about 15-20 nanometers. The recess 142 may have a depth 142a within a range of about 5-10 nanometers. In some examples, the amount of material removed from the NFET device may be 1.5-2.5 times the amount of material removed from the PFET device using the selective etching process described herein.

Figures 6A, 6C:
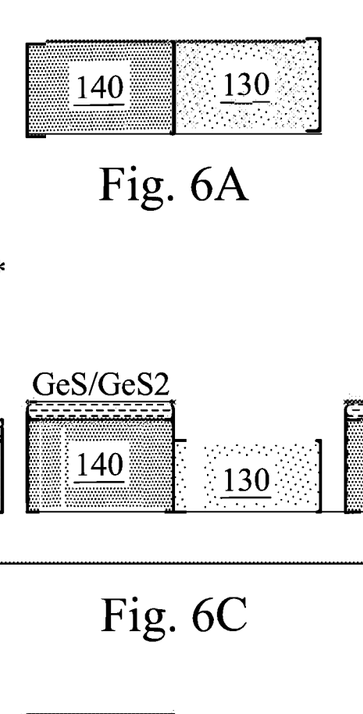
FIGS. 6A-6E illustrates a partial view of the semiconductor device in FIG. 5 going through a recess forming process.

Referring to FIGS. 6A-6E, at operation 18, the difference in depths of the recesses 132 and 142 may be achieved by tailoring etch conditions to realize different etch rates of S/D features. In an embodiment, the n-type merged epitaxial feature 130 includes silicon doped with phosphorous but not silicon germanium, and the p-type merged epitaxial feature 140 includes silicon germanium. A selective etch procedure may be performed on the semiconductor structure to remove upper portions of the epitaxial S/D features 130 and 140, where the removed portion of the n-type epitaxial S/D feature 130 is thicker (e.g., 1.5 times to 2.5 times thicker at corresponding points on the epitaxial S/D features) than the removed portion of the p-type epitaxial S/D feature 140. FIG. 6A illustrates the n-type epitaxial S/D feature 130 and the p-type merged epitaxial feature 140 before the selective etching process is applied.

Figure 6B:
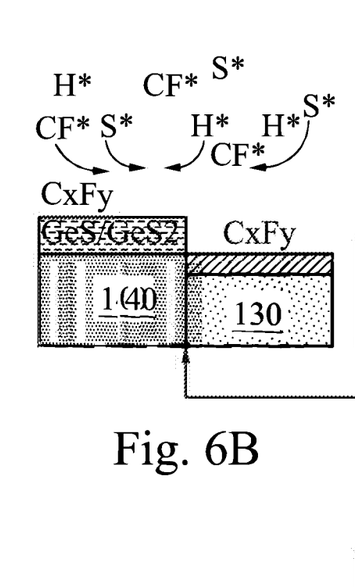
Figure 6D:
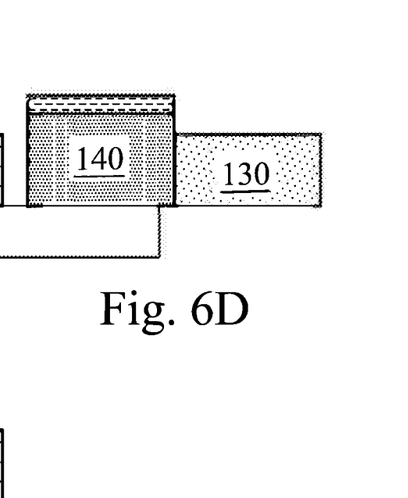
Figure 6E:
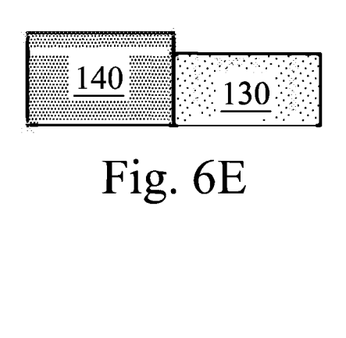
Figure 7:
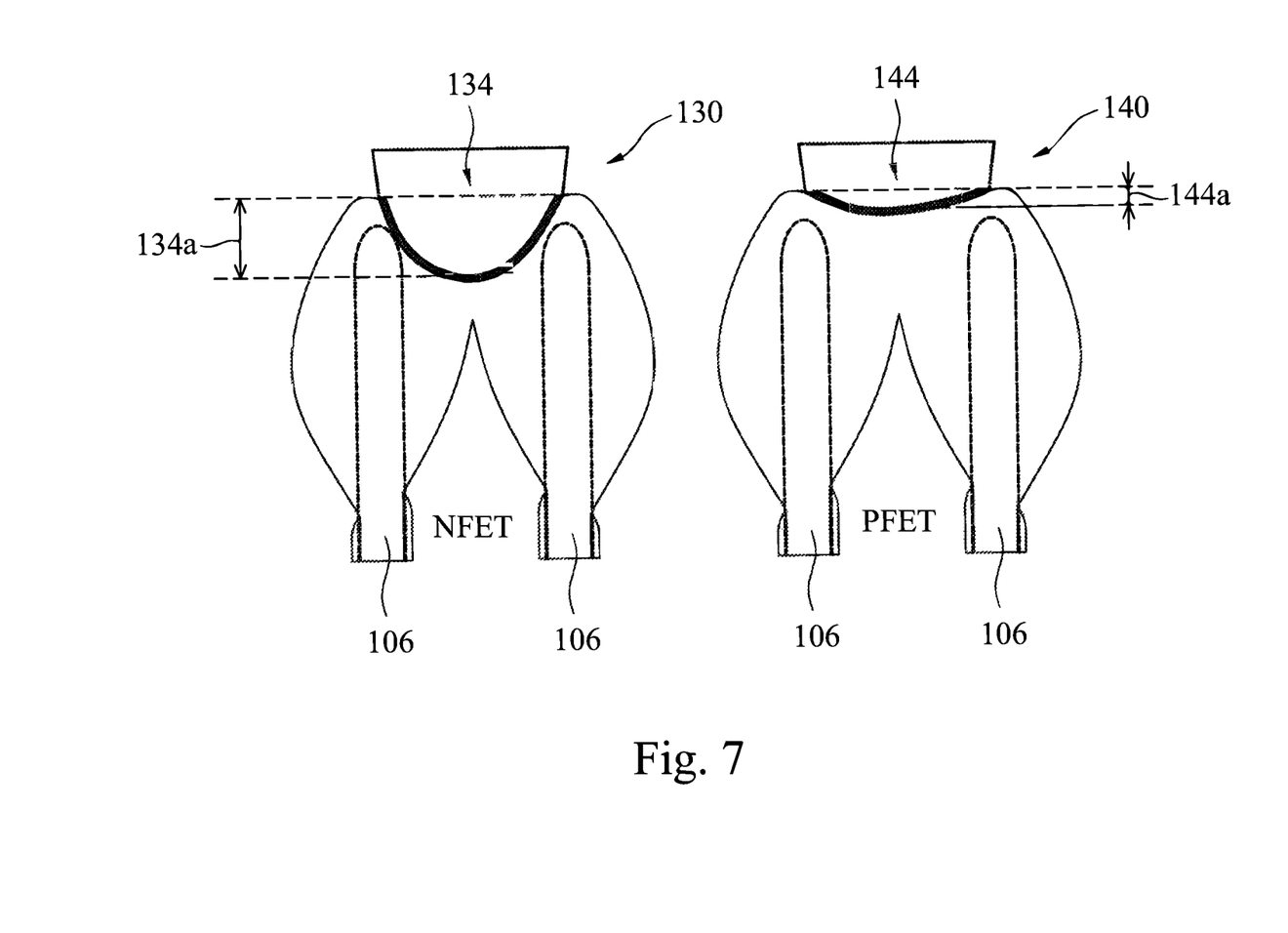

In the depicted embodiment, the selective etch procedure includes a plurality of cycles, where each cycle comprises performing a first dry etch process on the semiconductor structure using the gas mixture, as shown in FIGS. 6B-6D. As shown in FIG. 6B, the top surfaces of the merged epitaxial S/D features 130 and 140 are subject to an etchant gas. In some embodiments, the etchant gas is a gas mixture that includes fluoromethane ($CH_3F$), hydrogen ($H_2$), and carbonyl sulfide (COS). As an example of ratios between gas components, there may be about 1 portion of fluoromethane ($CH_3F$), about 10 to about 20 portions of hydrogen ($H_2$), and about 0.5 to about 1.5 portions of carbonyl sulfide (COS). The gas mixture reacts with silicon germanium in the p-type epitaxial S/D feature in the first dry etch process thereby forming a polymer layer that includes germanium sulfide (GeS or $GeS_2$). The first dry etch process removes a first thickness of the n-type epitaxial S/D feature and a second thickness of the p-type epitaxial S/D feature. The second thickness (which may be close to 0) is less than (e.g., about 1 nm less than) the first thickness due to the presence of the polymer layer on the p-type epitaxial S/D feature. As shown in FIG. 6B, the first dry etch process also forms carbon fluoride ($C_xF_y$) as a byproduct on both the n-type epitaxial S/D feature and the p-type epitaxial S/D feature. In an embodiment, the thickness of the carbon fluoride layer before flush is equal to or less than 5 nm. Thus, as shown in FIG. 6C, each cycle of the selective etch procedure also includes performing a second dry etch process on the semiconductor structure using a gas that includes diazene ($N_2H_2$) to remove the carbon fluoride formed in the first dry etch process. In an embodiment, the thickness of the germanium sulfide (GeS or $GeS_2$) layer after etch is equal to or less than about 1 nm. After the multiple cycles of the selective etch procedure, as shown in FIG. 6D, the n-type epitaxial S/D feature 130 has been etched more than the p-type merged epitaxial feature 140. As shown in FIG. 6E, a wet clean process may be performed to remove, from the p-type epitaxial S/D feature, $GeS/GeS_2$ that has been formed in the first dry etch process of each cycle.

In an embodiment, the plurality of cycles of the selective etch process are conducted at temperatures between 20-60 degrees Celsius and pressures between 10-30 millitorr. In an embodiment, during each cycle of the selective etch process, the removed first thickness of the n-type epitaxial S/D feature is at least 1 nm thicker than the removed second thickness of the p-type epitaxial S/D feature. In an embodiment, the removed portion of the n-type epitaxial S/D feature is between about 1.5 to about 2.5 times in thickness of the removed portion of the p-type epitaxial S/D feature.

In an embodiment, forming the recessed trench 132 (or 142) comprises etching the merged S/D feature to form an intermediate trench; depositing a silicon nitride (e.g., $Si_3N_4$) spacer feature in and over the intermediate trench; removing a bottom portion of the silicon nitride spacer feature using anisotropic etching while keeping sidewall portions of the silicon nitride spacer feature; and further etching the merged S/D feature in the intermediate trench, thereby forming the recessed trench.

Referring back to FIG. 5, the method 10 may also form silicidation or germano-silicidation on the surfaces of the epitaxial S/D features 130 and 140. For example, silicidation, such as nickel silicide or titanium silicide, may be formed by depositing a metal layer over the epitaxial S/D features 130 and 140, annealing the metal layer such that the metal layer reacts with silicon in the epitaxial S/D features 130 and 140 to form the metal silicidation, and thereafter removing the non-reacted metal layer. In an alternative embodiment, the method 10 does not form the silicidation and the method 10 forms the silicidation after etching contact holes, as described below.

Referring to FIG. 7, the method 10 at operation 20 forms S/D contacts 134 and 144 over the epitaxial S/D features 130 and 140, respectively. As shown in FIG. 7, since the recess trench 132 on the epitaxial S/D feature 130 is deeper than the recess trench 142 on the epitaxial S/D feature 140, a bottom surface of the S/D contact 134 is lower than a bottom surface of the second S/D contact 144. The S/D contact 134 may have a depth 134a within the S/D feature 130 within a range of about 15-20 nanometers. The S/D contact 144 may have a depth 144a within the S/D feature 140 within a range of about 5-10 nanometers. Each S/D contact may include one or more conductive layers and may be formed using any suitable methods such as ALD, CVD, PVD, plating, and/or other suitable processes. In some embodiments, each S/D contact includes a seed metal layer and a fill metal layer. In various embodiments, the seed metal layer includes cobalt (Co), tungsten (W), ruthenium (Ru), nickel (Ni), other suitable metals, or combinations thereof. The fill metal layer may include copper (Cu), tungsten (W), aluminum (Al), cobalt (Co), other suitable materials, or combinations thereof.

Referring to FIG. 1, the method 10 at operation 28 may perform additional processing steps. For example, additional vertical interconnect features such as vias, horizontal interconnect features such as lines, and/or multilayer interconnect features such as metal layers and interlayer dielectrics can be formed over the device 100. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Although not intended to be limiting, one or more embodiments of the present disclosure provide many benefits to a semiconductor device and the formation thereof. The present disclosure provides methods of forming a merged epitaxial S/D feature with an optimized profile. Embodiments of the present disclosure includes forming a merged epitaxial S/D feature with controllable merge height and recess depth. Accordingly, the disclosed epitaxial S/D feature reduces its contact resistance with overlying S/D contacts as well as capacitance with nearby metal gate structures.

According to one example, a method of semiconductor fabrication includes providing a semiconductor structure having a substrate and first, second, third, and fourth fins above the substrate. The method further includes forming an n-type epitaxial source/drain (S/D) feature on the first and second fins, forming a p-type epitaxial S/D feature on the third and fourth fins, and performing a selective etch process on the semiconductor structure to remove upper portions of the n-type epitaxial S/D feature and the p-type epitaxial S/D feature such that more is removed from the n-type epitaxial S/D feature than the p-type epitaxial S/D feature.

According to one example, a method includes providing a semiconductor structure having a substrate and first and second fins above the substrate, removing upper portions of the first and second fins while keeping lower portions of the first and second fins, growing first and second epitaxial source/drain (S/D) features on the lower portions of the first and second fins such that the first and second epitaxial S/D features merge, thereby forming a merged S/D feature with a controllable merge height, forming a recessed trench in the merged S/D feature, and filling into the recessed trench an S/D contact that is in electrical contact with the merged S/D feature.

According to one example, a semiconductor device includes a substrate, a first, second, third, and fourth fins protruding from the substrate, an n-type epitaxial source/drain (S/D) feature disposed on the first and second fins, a first S/D contact disposed on the n-type epitaxial S/D feature, a p-type epitaxial S/D feature disposed on the third and fourth fins, and a second S/D contact disposed on the p-type epitaxial S/D feature, wherein a bottom surface of the first S/D contact is lower than a bottom surface of the second S/D contact.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of semiconductor fabrication, comprising:
providing a semiconductor structure having:
a substrate; and
first, second, third, and fourth fins above the substrate;
forming an n-type epitaxial source/drain (S/D) feature on the first and second fins; and
forming a p-type epitaxial S/D feature on the third and fourth fins; and
performing a selective etch process on the semiconductor structure to remove upper portions of the n-type epitaxial S/D feature and the p-type epitaxial S/D feature such that more is removed from the n-type epitaxial S/D feature than the p-type epitaxial S/D feature.

2. The method of claim 1, wherein the selective etch process includes a plurality of cycles, wherein each cycle comprises:
performing a first dry etch process on the semiconductor structure using a first etchant gas;
performing a second dry etch process on the semiconductor structure using a second etchant gas different from the first etchant gas; and
performing a wet clean process to remove a polymer layer that has been formed in the first dry etch process.

3. The method of claim 2, wherein the first etchant gas is a gas mixture that includes fluoromethane ($CH_3F$), hydrogen ($H_2$), and carbonyl sulfide (COS), wherein the gas mixture reacts with silicon germanium in the p-type epitaxial S/D feature in the first dry etch process, thereby forming the polymer layer that includes silicon sulfide.

4. The method of claim 3, wherein the first dry etch process removes a first thickness of the n-type epitaxial S/D feature, wherein the first dry etch process removes a second thickness of the p-type epitaxial S/D feature that is less than the first thickness due to presence of the polymer layer on the p-type epitaxial S/D feature, and wherein the first dry etch process also forms carbon fluoride ($C_xF_y$) as a byproduct on both the n-type epitaxial S/D feature and the p-type epitaxial S/D feature.

5. The method of claim 4, wherein the second etchant gas includes diazene ($N_2H_2$) configured to remove the carbon fluoride formed in the first dry etch process.

6. The method of claim 3, wherein the wet clean process removes, from the p-type epitaxial S/D feature, silicon sulfide that has been formed in the first dry etch process of each cycle.

7. The method of claim 2, wherein the plurality of cycles of the selective etch process are conducted at temperatures between 20-60 degrees Celsius and pressures between 10-30 millitorr.

8. The method of claim 2, wherein, during each cycle of the selective etch process, a first thickness of the n-type epitaxial S/D feature is at least 1 nm thicker than a second thickness of the p-type epitaxial S/D feature.

9. The method of claim 1, wherein the removed portion of the n-type epitaxial S/D feature is between about 1.5 to about 2.5 times in thickness of the removed portion of the p-type epitaxial S/D feature.

10. The method of claim 1, wherein the n-type epitaxial S/D feature is formed to include silicon doped with phosphorous but does not include silicon germanium, and wherein the p-type epitaxial S/D feature is formed to include silicon germanium.

11. A method, comprising:
providing a semiconductor structure having a substrate and first and second fins above the substrate;
removing upper portions of the first and second fins while keeping lower portions of the first and second fins;
growing first and second epitaxial source/drain (S/D) features on the lower portions of the first and second fins such that the first and second epitaxial S/D features merge, thereby forming a merged S/D feature with a controllable merge height, wherein the merged S/D feature includes:
a first layer of semiconductor material (L1) grown on the lower portions of the first and second fins;
a second layer of semiconductor material (L2-1) grown on the L1; and
a third layer of semiconductor material (L2-2) grown on the L2-1, wherein the L2-2 has a substantially conformal thickness over the first and second fins;
after forming the merged S/D feature, etching the merged S/D feature to thereby form a recessed trench in the merged S/D feature; and
filling into the recessed trench an S/D contact that is in electrical contact with the merged S/D feature.

12. The method of claim 11, wherein a height of the remaining lower portions of the first and second fins is between about 30% and about 40% of a height of the first and second fins.

13. The method of claim 11, wherein the L1 on the first fin and the L1 on the second fin do not merge, wherein the L2-1 on the first fin and the L2-1 on the second fin merge at the controllable merge height.

14. The method of claim 13, wherein the controllable merge height is dependent on a ratio between silane ($SiH_4$) and dichlorosilane (DCS) gases which are used to form the L2-1.

15. The method of claim 14, wherein the controllable MH is at a position equal to or higher than about 55% of the height of the first and second fins.

16. The method of claim 11, wherein forming the recessed trench comprises:
etching the merged S/D feature to form an intermediate trench;
depositing a silicon nitride spacer feature in and over the intermediate trench;

removing a bottom portion of the silicon nitride spacer feature using anisotropic etching while keeping sidewall portions of the silicon nitride spacer feature; and further etching the merged S/D feature in the intermediate trench, thereby forming the recessed trench.

17. A method, comprising:

forming first, second, third, and fourth fins protruding from a substrate;

forming an n-type epitaxial source/drain (S/D) feature on the first and second fins; and forming a first S/D contact on the n-type epitaxial S/D feature;

forming a p-type epitaxial S/D feature on the third and fourth fins;

forming a second S/D contact on the p-type epitaxial S/D feature; and prior to forming the first and second S/D contacts, performing a selective etch process on the n-type and p-type epitaxial source/drain features to remove upper portions of the n-type epitaxial S/D feature and the p-type epitaxial S/D feature such that more is removed from the n-type epitaxial S/D feature than the p-type epitaxial S/D feature, wherein a bottom surface of the first S/D contact is lower than a bottom surface of the second S/D contact.

18. The method of claim 17, wherein the n-type epitaxial S/D feature includes silicon doped with phosphorous but does not include silicon germanium, and wherein the p-type epitaxial S/D feature includes silicon germanium.

19. The method of claim 17, wherein the selective etch process includes:

performing a first dry etch process using a first etchant gas; and performing a second dry etch process using a second etchant gas different from the first etchant gas.

20. The method of claim 19, wherein the performing of the first dry etch process forms a polymer layer on the p-type epitaxial S/D feature.

* * * * *